United States Patent [19]

Ooami et al.

[11] Patent Number: 4,665,509

[45] Date of Patent: May 12, 1987

[54] SEMICONDUCTOR MEMORY DEVICE COMPRISING ADDRESS HOLDING FLIP-FLOP

[75] Inventors: Kazuo Ooami, Yokohama; Yasuhisa Sugo, Tokyo, both of Japan

[73] Assignee: Fujitsu Limited, Kawasaki, Japan

[21] Appl. No.: 533,985

[22] Filed: Sep. 20, 1983

[30] Foreign Application Priority Data

Sep. 30, 1982 [JP] Japan ................................. 57-171572

[51] Int. Cl.$^4$ ............................................... G11C 8/00
[52] U.S. Cl. ...................................... 365/233; 364/132
[58] Field of Search ....................... 365/189, 230, 233; 364/132

[56] References Cited

U.S. PATENT DOCUMENTS 3,732,440 11/1973 Platt et al. ............................ 365/154
4,409,680 10/1983 Schnathorst et al. ................ 365/233
4,528,647 7/1985 Chamberlain ........................ 365/230

FOREIGN PATENT DOCUMENTS 0018739 4/1980 European Pat. Off. .

*Primary Examiner*—James W. Moffitt
*Attorney, Agent, or Firm*—Staas & Halsey

[57] ABSTRACT

This invention relates to a semiconductor memory having flip-flops which hold the address input in order to absorb skew thereof within the same chip. The flip-flops are connected to be of the master-slave type and an address decoder is provided between the master flip-flops and the slave flip-flops. A part of the time required for latching the address signal into the master flip-flops and a part of the time required for decoder operation are overlapped, and thereby a high operation rate can be realized. Parts of the circuits forming the flip-flop circuits are used in common to the address input buffer and also in common to the word line driver circuits.

8 Claims, 5 Drawing Figures

SEMICONDUCTOR MEMORY DEVICE COMPRISING ADDRESS HOLDING FLIP-FLOP

BACKGROUND OF THE INVENTION

This invention relates to a semiconductor memory device, and more specifically to a semiconductor memory device using, for example, a bipolar RAM, wherein an address holding flip-flop which has usually been provided in the external circuit of the RAM is comprised within the IC circuit.

In a semiconductor memory device using a bipolar RAM, a flip-flop has been provided as an external circuit at the input stage of the RAM in order to absorb skew in the timing of when the bits which form the address information appear. However, when the flip-flop is provided externally, a device is inferior in integration density, and is troublesome during the manufacturing process and in the operation rate. Therefore it is desired to include the flip-flop within a RAM IC.

SUMMARY OF THE INVENTION

This invention is intended to solve the above problem by providing a semiconductor memory device which comprises said flip-flop within the IC and realizes a higher operation rate by executing decoding in parallel by a decoder while a buffer circuit absorbs a skew in the time of when an address information appears. In order to attain this object, a semiconductor memory device of this invention is characterized by that a decoder is provided between the master flip-flop and the slave flip-flop.

DESCRIPTION OF PREFERRED EMBODIMENTS

Figure 1:
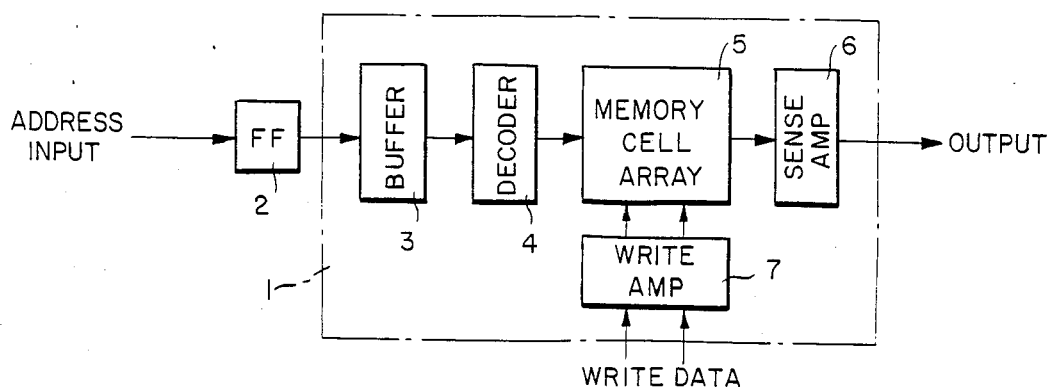
FIG. 1 is an example of the structure of a conventional semiconductor memory device.

In FIG. 1, 1 is a RAM IC circuit; 2 is an address holding flip-flop; 3 is a buffer circuit; 4 is a decoder; 5 is a memory cell array; 6 is a sense amplifier; and 7 is a write amplifier. An address information to be input is set into the flip-flop 2 in order to absorb skew between bits, and its content is supplied to the decoder 4 through the buffer 3.

Figure 2:
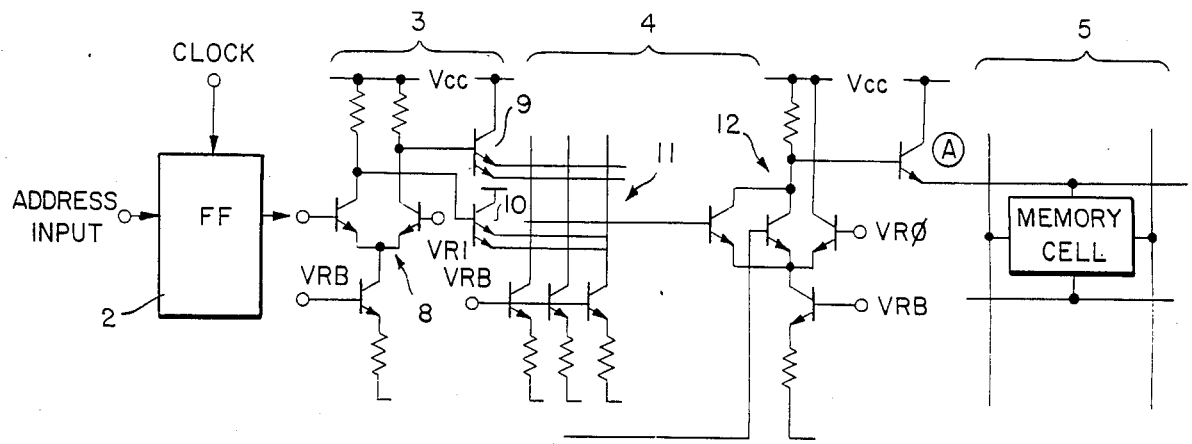
FIG. 2 is a detailed view of the main part of the device of FIG. 1.

FIG. 2 shows a detailed view of the main part of the structure shown in FIG. 1. The symbols 2, 3, 4, 5 in the figure correspond to those in FIG. 1. An address is generally composed of plural bits, but in this figure only one bit is depicted. One bit of the address information to be input is synchronized with a clock input and is set into the flip-flop 2. The content of the flip-flop 2 is guided to the differential amplifier 8 in the buffer circuit 3. The true output and the inverted output from said differential amplifier 8 are respectively supplied to the matrix 11 of the decoder 4 through the multi-emitter transistors 9, 10. The result of the selection by said matrix 11 is guided to the logic part 12 to drive a word drive line as shown by A for the memory cell 5.

The conventional device is constituted as explained above, but in the present invention the flip-flop 2 shown in FIG. 2 is comprised within the RAM IC circuit.

Figure 3:
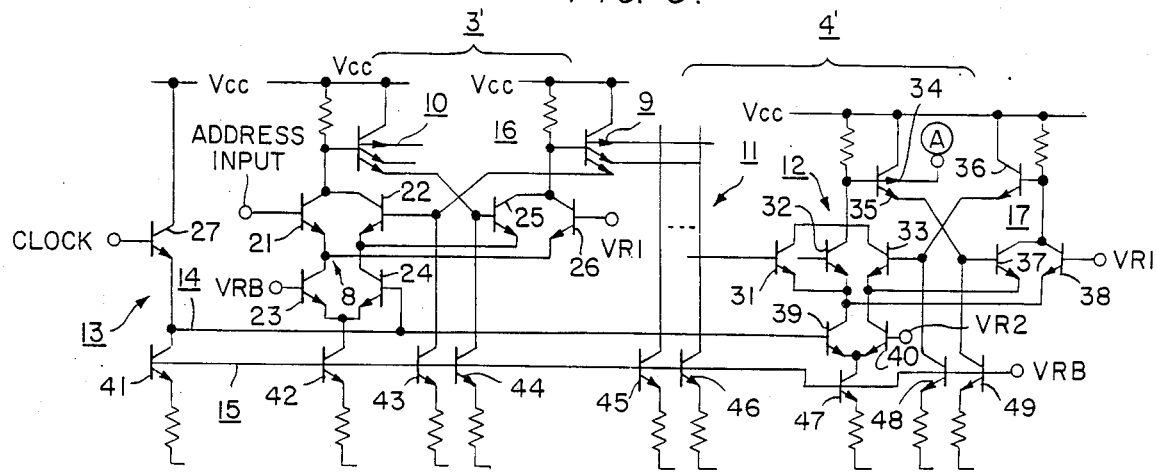
FIG. 3 is a structure of the main part of an embodiment of the present invention.
Figure 5:
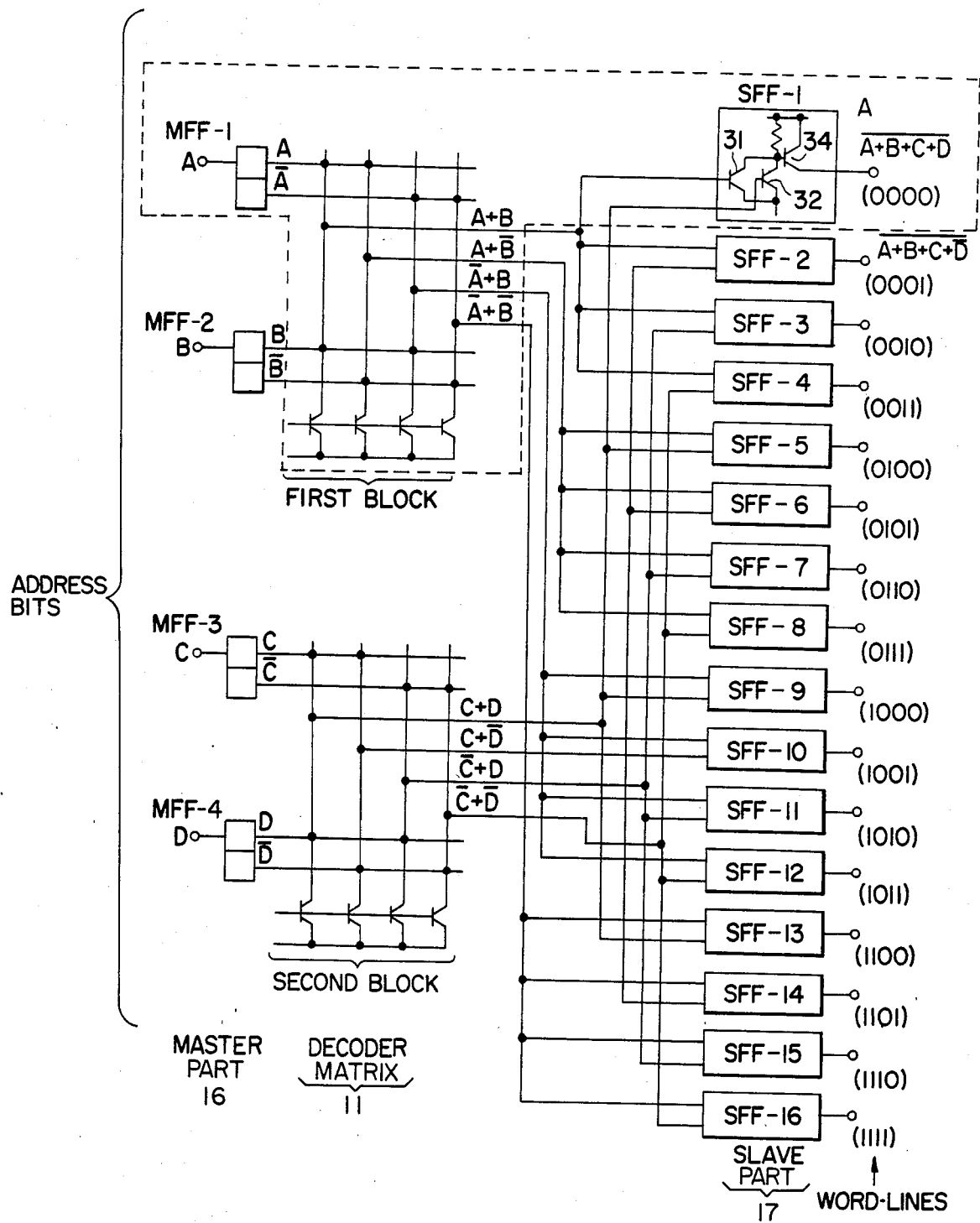
FIG. 5 shows an embodiment of the present invention.

FIG. 3 indicates a main part of an embodiment of this invention shown in FIG. 5. The symbols 3, 4, 8, 9, 10, 11, 12 in the figure correspond to those in FIG. 2. Moreover, 13 is a clock gate circuit, 14 is a control line, 15 is a reference voltage line, and 16, 17 are master and slave flip-flops, respectively. The symbols 21 to 27, 31 to 33 and 36 to 49 represent transistors. There are N master flip-flops 16 when the number of address bits is considered to be N, and there are a total of $2^N$ slave flip-flops 17.

In FIG. 3, the buffer circuit 3 forms the master part 16 of a master-slave flip-flop circuit, while the logic part 12 of the decoder 4' forms the slave part 17 of the master-slave flip-flop circuit, and the switching of each said master-slave flip-flop circuit is controlled by the clock gate circuit 13. Operation of the structure shown in FIG. 3 is explained in accordance with the periods ①, ②, ③ shown in the time charts of FIG. 4. Reference voltages are indicated by VRB, VR1 and VR2.

Timing period ①

In this period, a clock input is at low level. When an address input is at high level, the transistor 23 becomes ON, and transistor 24 becomes OFF since the control line 14 is also at low level. Therefore, the transistor 21 turns ON and transistors 22, 25, 26 turn OFF. The base voltage of transistor 10 becomes low while the base voltage of transistor 9 is at high level, and these states are output to the matrix 11 of decoder 4' through the emitter followers of transistors 10 and 9.

The matrix 11 of decoder 4' provides a plurality of blocks such as, for example, a first block which has the inputs A, $\bar{A}$, B, $\bar{B}$, and a second block which has the inputs C, $\bar{C}$, D, $\bar{D}$ as shown in FIG. 5. Each block corresponds, for example, to the state of one pair of the inputs A, B and only one of four output lines of each block becomes low (the other three lines are at high level), corresponding to any one of four states "00", "01", "10", "11". Here, it is considered that the above inputs A, $\bar{A}$, correspond to an output (A) from the transistor 10 shown in FIG. 3 and an output ($\bar{A}$) from the transistor 9, and said inputs B, $\bar{B}$ correspond to outputs of transistors, not shown, corresponding to the transistors 10 and 9.

One of four outputs from the first block in the matrix 11 of decoder 4 is input to the base of transistor 31 shown in FIG. 3. In addition, one of the four outputs from each of the other blocks is input to the base of a respective transistor, such as transistor 32 shown in FIG. 3. The features are indicated in FIG. 5 for the particular case above, namely for a four bit address and for sixteen decoder outputs. The dotted line indicates the circuit portion in FIG. 3, and like reference characters indicate the same components as in FIG. 3, showing four master flip-flops MFF-1 to MFF-4 and sixteen slave flip-flops SFF-1 to SFF-16 FIG. 5 shows the decoder matrix 11 separating the respective master and slave parts of the master-slave flip-flop circuit according to the present invention.

For simplification, when it is supposed that only two blocks are used, only two transistors 31, 32 exist corresponding to the pertinent block in the logic part 12 of decoder 4', and, only when the desired address is given, are the base voltages of the above two transistors 31 and 32 at the low state in correspondance thereto.

When the desired address is given as explained above, the base voltages of the transistors 31 and 32 are at low level, the clock (CLK) being at the low level in the above period ①. Therefore, the base voltage of the transistor 39 is at low level, and, even when a signal appears at the bases of the transistors 31 and 32, the base voltage of the transistor having plural emitters 34, 35 (or of a plurality of transistors having respective emitters) is not yet changed. Namely, the word line in the memory cell is not yet driven, as shown by A in FIG. 4.

Timing period ②

In this period, an address input is continuously at high level and the clock input becomes high level. Therefore, the transistors 21, 23 in the ON state become OFF, while the transistors 22, 24 become ON. However, the base voltage of the transistors 10 and 9 does not change. Namely, an input of the same level as in the period ① is first given to the base of transistors 31, 32 in the logic part 12 of the decoder 4′.

Figure 4:
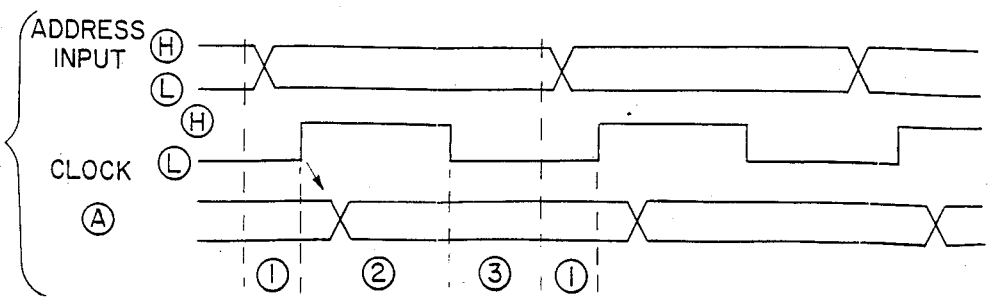
FIG. 4 shows time charts for the operation of the embodiment of FIG. 3.

When the clock becomes high in the period ②, the transistor 39 becomes ON, transistors 31, 32 become OFF, transistor 38 becomes ON, and transistors 33, 37, 40 become OFF. Thereby, the base voltage of the transistor having plural emitters 34, 35 becomes high, the base voltage of transistor 36 becomes low, and the voltage of the point Ⓐ of FIG. 3 becomes high as shown in FIG. 4. Thus, a word drive line in each memory cell can be selected.

Timing period ③

In this period, the clock input is at low level and a desired address can be input. Namely, when the clock input becomes low level again from the condition of period ②, the transistor 33 becomes ON. When the transistor 39 becomes OFF and the transistor 40 becomes ON, the transistor 37 becomes ON and the transistor 38 becomes OFF. However, the transistor 36 is continuously OFF, the base of the transistor having plural emitters 34, 35 is continuously high and the point Ⓐ is also continuously high. Even when an address input takes any value in this period, the transistor 39 is OFF and the condition of point Ⓐ does not change.

As explained above, when an address input is given in the embodiment of FIG. 3, the result of decoding of the pertinent address is held in such a form as being latched into the input stage of the logic part 12 by the master and slave flip-flops 16, 17. Namely, a pair of flip-flop circuits are connected in sequence as described and complementarily enabled by the timing signals. Thereby a stable output can be obtained irregardless of the relative timing of the input signal and the time of enabling each flip-flop circuit. In the above example, only the decoder line of the word drive line is explained, but this explanation can also be applied to the decoder of the bit lines in the same way.

As explained above, according to this invention, the result decoded by a given address input is held in such a manner as being latched into the input stage of the decoder logic part 12 forming the master-slave flip-flop circuits. Therefore, fluctuation of the address input can be absorbed during the time until a clock input is given, and high speed operation can also be attained.

What is claimed:

1. A semiconductor memory device comprising
   a plurality of N first flip-flop circuits which receive respective bits of an address and provide respective outputs,
   a decoder means operatively connected to receive said outputs of the first flip-flop circuits, for respectively decoding said outputs and for outputting respective signals,
   a plurality of 2N second flip-flop circuits connected to receive said signals output from said decoder means, and to supply respective outputs, and
   a plurality of lines selected from and bit lines of the memory which are driven by said outputs of said second flip-flop circuits;
   wherein each respective pair of said first and second flip-flop circuit provide a respective master-slave flip-flop circuit, and each said address includes N bits.

2. The device of claim 1, comprising clock means for providing a clock signal, wherein the respective bits of said address are provided to said first flip-flop circuits during the time when said clock signal is at low level, and wherein said outputs of said second flip-flops change, in correspondence to said address bits and the respective ones of said outputs from said decoder means, when said clock signal changes from said low to high level.

3. A semiconductor memory device comprising
   a plurality of first flip-flop circuits which receive respective bits of an address and provide respective outputs,
   a decoder means operatively connected to receive said outputs of the first flip-flop circuits, for respectively decoding said outputs and for outputting respective signals,
   a plurality of second flip-flop circuits connected to receive said signals output from said decoder circuits, and to supply respective outputs,
   a plurality of lines selected from word and bit lines of the memory which are driven by said outputs of said second flip-flop circuits, and
   a clock input for enabling said first and second flip-flops,
   wherein each respective pair of said first and second flip-flop circuits provide a respective master-slave flip-flop circuit, and said first and second flip-flops of each said master-slave flip-flop circuit operate complementarily in response to said clock input.

4. The device of claim 3, comprising respective pluralities of said first and second flip-flops and said decoder means to provide said master-slave flip-flop circuits for both of said word and bit lines.

5. The device of claim 3, said first flip-flops being included in the same integrated circuit as said decoder means and second flip-flops.

6. A semiconductor memory device comprising
   plurality of first flip-flop circuits which receive respective bits of an address and provide respective outputs,
   a decoder means operatively connected to receive said outputs of the first flip-flop circuits, for respectively decoding said outputs and for outputting respective signals,
   a plurality of second flip-flop circuits connected to receive said signals output from said decoder circuits, and to supply respective outputs,
   a plurality of lines selected from word and bit lines of the memory which are driven by said outputs of said second flip-flop circuits, and clock means for providing a clock signal,
wherein each respective pair of said first and second flip-flop circuits provide a respective master-slave flip-flop circuit, respective bits of said address are provided to said first flip-flop circuits during the time when said clock signal is at low level, and said outputs of said second flip-flops change, in correspondence to said address bits and the respective ones of said outputs from said decoder means, when said clock signal changes from said low to high level.

7. The device of claim 1, 6, 2, 4 or 5, wherein said decoder means comprises a plurality of decoder circuits, each said decoder circuit having as inputs the outputs from respective ones of said first flip-flop circuits, and each said decoder circuit supplying respective ones of said signals output from said decoder means.

8. The device of claim 7, each said decoder circuit comprising a block decoder for outputting a respective logic function of the respective inputs thereto.

* * * * *

UNITED STATES PATENT AND TRADEMARK OFFICE
CERTIFICATE OF CORRECTION

PATENT NO. : 4,665,509

DATED : MAY 12, 1987

INVENTOR(S) : KAZUO OOAMI ET AL.

It is certified that error appears in the above-identified patent and that said Letters Patent is hereby corrected as shown below:

Col. 2, line 2, "A" should be --Ⓐ--.

Col. 3, line 12, "A" should be --Ⓐ--.

Col. 4, line 8, "2N" should be --$2^N$--.

Signed and Sealed this

Twenty-seventh Day of October, 1987

Attest:

DONALD J. QUIGG

Attesting Officer

Commissioner of Patents and Trademarks